(12) United States Patent
Fujiyoshi et al.

(10) Patent No.: US 12,396,207 B2
(45) Date of Patent: Aug. 19, 2025

(54) SILICON CARBIDE SEMICONDUCTOR DEVICE AND POWER CONVERSION APPARATUS

(71) Applicant: Mitsubishi Electric Corporation, Tokyo (JP)

(72) Inventors: Katsuhiro Fujiyoshi, Tokyo (JP); Toshikazu Tanioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 677 days.

(21) Appl. No.: 17/852,284

(22) Filed: Jun. 28, 2022

(65) Prior Publication Data

US 2023/0053501 A1 Feb. 23, 2023

(30) Foreign Application Priority Data

Aug. 17, 2021 (JP) ................. 2021-132674

(51) Int. Cl.
*H01L 29/78* (2006.01)
*H10D 30/66* (2025.01)
*H10D 62/832* (2025.01)
*H10D 64/00* (2025.01)
*H02M 7/537* (2006.01)

(52) U.S. Cl.
CPC ....... *H10D 30/665* (2025.01); *H10D 62/8325* (2025.01); *H10D 64/111* (2025.01); *H02M 7/537* (2013.01)

(58) Field of Classification Search
CPC ............. H10D 30/665; H10D 62/8325; H10D 64/111; H10D 62/106; H02M 7/537; H02M 7/003; H02M 7/53871; H02M 1/0009; H01L 23/3171; H01L 23/564
See application file for complete search history.

(56) References Cited

U.S. PATENT DOCUMENTS

2011/0220917 A1 9/2011 Hayashi et al.
2021/0118761 A1* 4/2021 Ebihara ................. H01L 23/24

FOREIGN PATENT DOCUMENTS

JP 2020-170788 A 10/2020
WO 2011027523 A1 3/2011

* cited by examiner

*Primary Examiner* — Mohammed R Alam
(74) *Attorney, Agent, or Firm* — Studebaker Brackett PLLC

(57) ABSTRACT

A silicon carbide semiconductor device includes an n-type epitaxial layer provided on a SiC substrate, a front surface electrode provided on the epitaxial layer, and a p-type electric field relieving region provided in the upper layer of the epitaxial layer in a terminal region. On the epitaxial layer, a first protective film composed of an interlayer insulating film and a protective oxide film that covers at least a part of the electric field relieving region is provided. A second protective film composed of a polyimide protective film is provided via a silicon nitride film so as to cover the outer end portion of the surface electrode, the first protective film, and at least a part of the epitaxial layer. The silicon nitride film protrudes from the second protective film at both an inner side end portion and an outer side end portion.

6 Claims, 8 Drawing Sheets

SILICON CARBIDE SEMICONDUCTOR DEVICE AND POWER CONVERSION APPARATUS

BACKGROUND OF THE INVENTION

Field of the Invention

The present disclosure relates to a silicon carbide semiconductor device.

Description of the Background Art

A semiconductor device in which a terminal region in which an electric field relieving region such as a guard ring is formed is provided outside an element region in which a semiconductor element is formed has been known. For example, Japanese Patent Application Laid-Open No. 2020-170788 below discloses a technique for suppressing the movement of a plurality of types of mobile ions existing in an interlayer insulating film provided on a terminal region. In addition, in the following International Publication No. 2011/027523, a technique has been disclosed in which a protective film formed of a polyimide film is provided on the chip of the semiconductor device via a silicon nitride (SiN) film having high moisture resistance to improve moisture resistance of the semiconductor device.

A structure in which a protective film is provided on a chip of a semiconductor device via a SiN film as in International Publication No. 2011/027523 does improve the moisture resistance of the semiconductor device, however, a risk of causing the discharge in silicon carbide (SiC) semiconductor devices can be raised. Silicon carbide semiconductor devices are superior in withstand voltage property to silicon (Si) semiconductor devices in terms of physical properties (having about ten-fold greater the strength of dielectric breakdown electric field), and low resistance can be realized by thinning. However, the very property thereof makes the electric field in the terminal region of the chip intense; therefore, securing withstand voltage and suppressing discharge in the terminal region require elaboration. In particular, a risk of causing the discharge rises in the terminal region reduced by providing the electric field relieving region.

Further, in a module in which a semiconductor device is incorporated, the upper portion of the chip of the semiconductor device is sealed with a sealing material such as a gel or a resin, whereby insulation is secured. However, there is a concern that the stress generated between the sealing material and the chip may cause peeling off of the protective film on the chip (peeling at the interface between the polyimide film and the SiN film). When the protective film is peeled off, the high electric field generated when a reverse bias is applied to the semiconductor device increases the risk of causing creeping discharge along the interface between the protective film and the SiN film.

SUMMARY

An object of the present disclosure is to provide a silicon carbide semiconductor device capable of suppressing the occurrence of discharge when a reverse bias is applied.

A semiconductor device includes a semiconductor substrate composed of silicon carbide, a semiconductor layer of first conductivity type provided on the semiconductor substrate, a first main electrode provided on the semiconductor layer, and a second main electrode provided on a back surface of the semiconductor substrate. An electric field relieving region of second conductivity type is provided in an upper layer of the semiconductor layer in a terminal region outside an element region in which the main current flows. A first protective film is provided on the semiconductor layer that covers at least a part of the electric field relieving region. A silicon nitride film is provided so as to cover an outer end portion of the first main electrode, the first protective film, and at least a part of the semiconductor layer outside the first protective film. A second protective film is provided on the silicon nitride film. The silicon nitride film protrudes from the second protective film at both an inner side end portion and an outer side end portion.

According to the present disclosure, by extending the region covered with the silicon nitride film from the second protective film, the creeping discharge distance becomes long, and the risk of discharge when reverse bias is applied can be suppressed. This ensures obtaining a highly reliable terminal structure with suppressed discharge.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

First Embodiment

Figure 1:
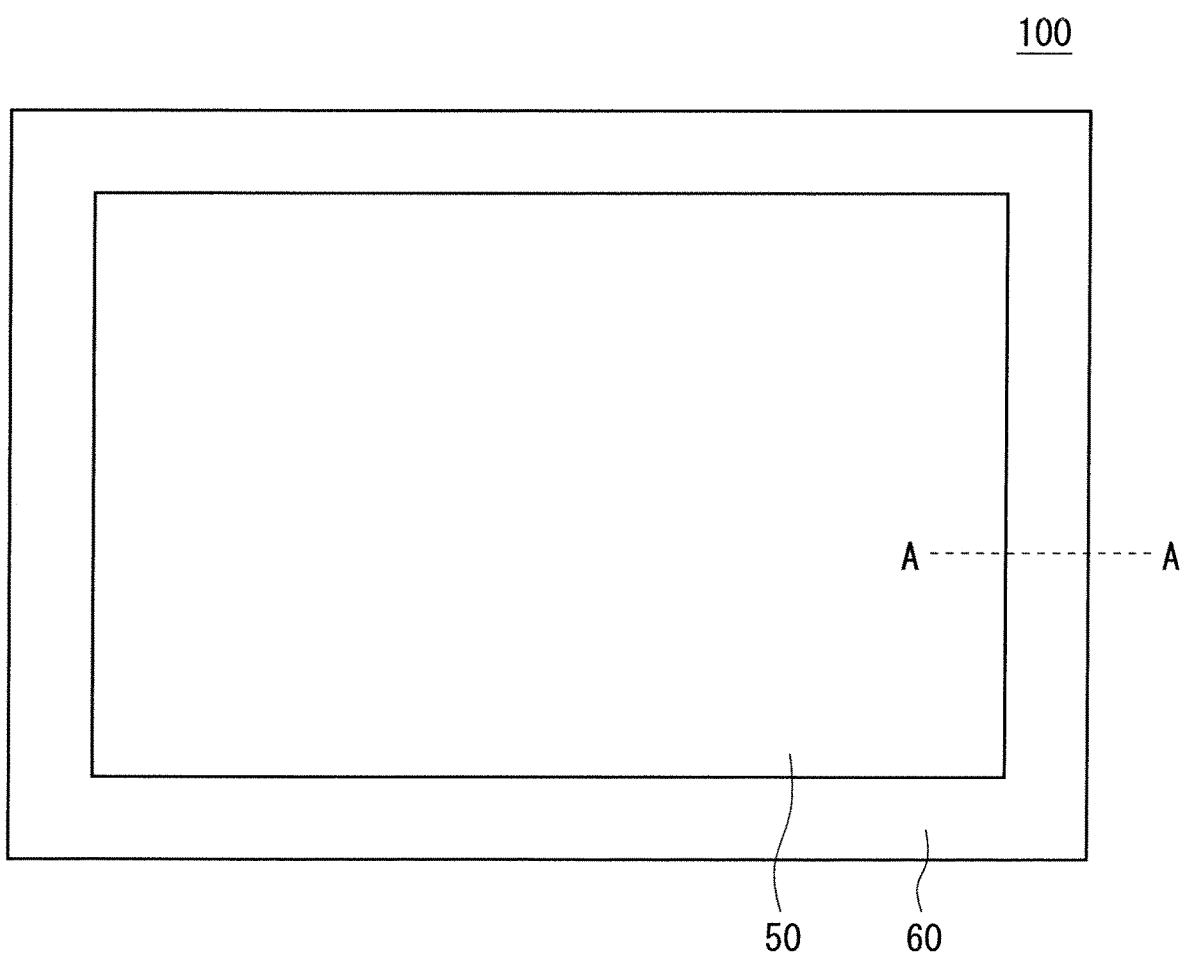
FIG. 1 is a plan view of a silicon carbide semiconductor device according to the first embodiment.
Figure 2:
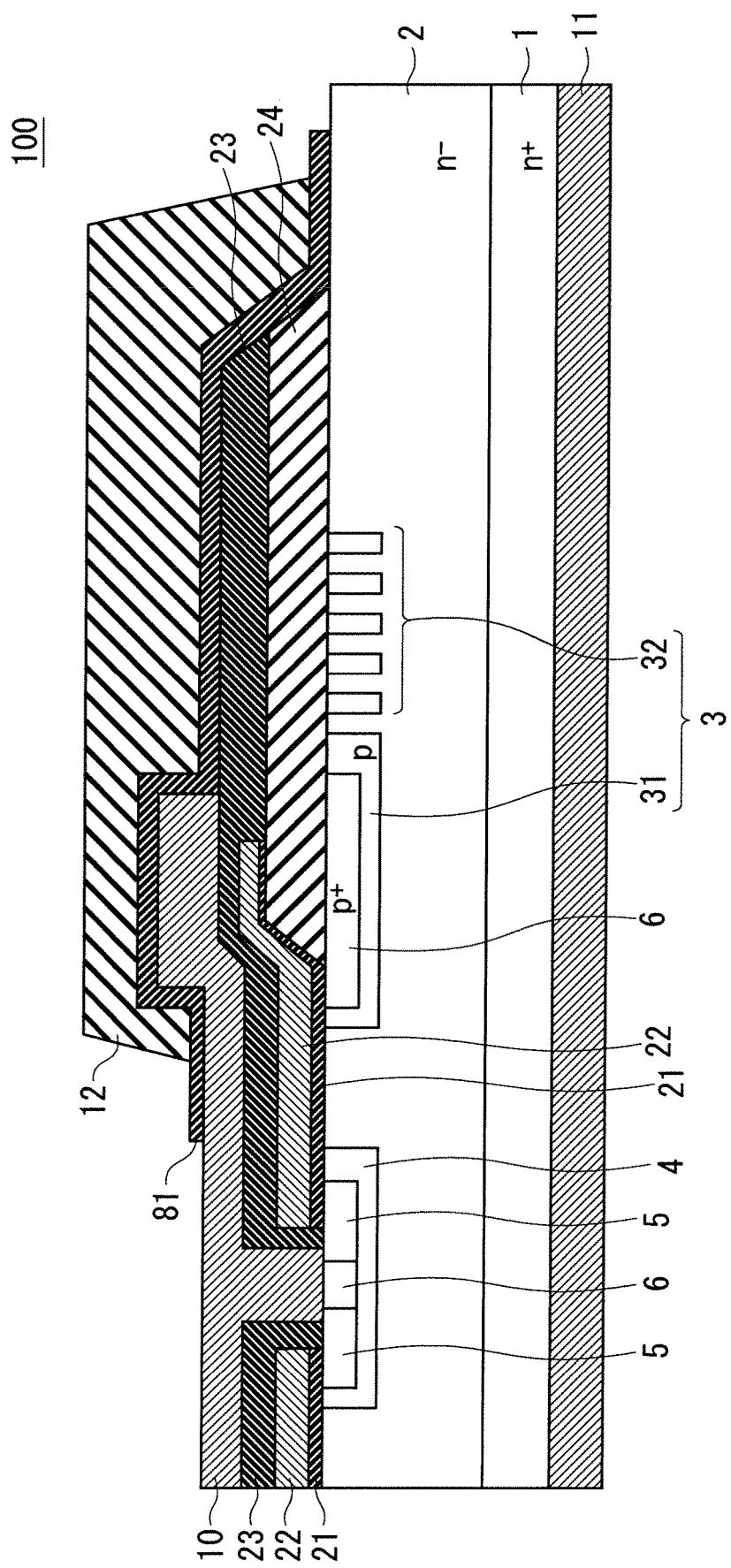
FIG. 2 is a cross-sectional view of the silicon carbide semiconductor device according to the first embodiment.

FIG. 1 is a plan view of a Metal-Oxide-Semiconductor Field-Effect Transistor (SiC-MOSFET) which is a silicon carbide semiconductor device 100 according to the first embodiment, and FIG. 2 is a cross-sectional view taken along the line A-A of FIG. 1. As illustrated in FIG. 1, an element region 50 and a terminal region 60 are defined in a chip of the silicon carbide semiconductor device 100. Further, the cross-sectional view of FIG. 2 includes a boundary between the element region 50 and the terminal region 60.

The element region 50 is a region in which a semiconductor element structure is formed and operates as a semiconductor element. In the first embodiment, a MOSFET structure is formed in the element region 50, and the element region 50 operates as a MOSFET. The terminal region 60 is provided so as to surround the element region 50 and is a region for maintaining the withstand voltage of the silicon carbide semiconductor device 100.

Here, the region in which the main current flows when the silicon carbide semiconductor device 100 is in the ON state is referred to as an "active region". Basically, although the element region 50 corresponds to the active region, for example, when a control pad for controlling the silicon carbide semiconductor device 100 is provided in the element region 50, the main current does not flow in the region of the control pad; therefore, the portion of the element region 50 excluding the region of the control pad is the active region. Examples of the control pad include a gate pad connected to the gate electrode of the MOSFET and a current sense pad for measuring the main current flowing through the MOSFET.

As illustrated in FIG. 2, the silicon carbide semiconductor device 100 is formed using a SiC substrate 1 which is a semiconductor substrate made of n-type (first conductive type) SiC, and an n-type epitaxial layer 2 having a peak concentration of impurities lower than that of SiC 1 is formed on the SiC substrate 1. The SiC substrate 1 is an n+ type semiconductor layer containing n-type impurities at a relatively high concentration, and the epitaxial layer 2 is an n− type semiconductor layer containing n-type impurities at a relatively low concentration. The thickness of the SiC substrate 1 is preferably 50 µm or more and 400 µm or less, and the thickness of the epitaxial layer 2 is preferably 3 µm or more and 100 µm or less.

A p-type (second conductive type) electric field relieving region 3 is selectively formed in the upper layer of the epitaxial layer 2 of the terminal region 60 so as to surround the active region. The electric field relieving region 3 is a region having a thickness of 0.2 µm or more and 2.0 µm or less containing p-type impurities.

In the first embodiment, the electric field relieving region 3 includes an impurity region 31 and impurity regions 32 formed outside the impurity region 31. The impurity region 31 has a larger cross-sectional area than the impurity region 32, and a plurality of impurity regions 32 are provided at intervals from each other. The number, spacing, and the like of the impurity regions 32 are designed based on the rating of the silicon carbide semiconductor device 100.

In the upper layer of the epitaxial layer 2 of the element region 50, a p-type well region 4 is selectively formed in the active region. The well region 4 is a region having a thickness of 0.2 µm or more and 2.0 µm or less containing p-type impurities. Although a single well region 4 is illustrated in FIG. 2, a plurality of well regions 4 are provided at intervals from each other in the active region. That is, the well region 4 illustrated in FIG. 2 is arranged at the outermost peripheral portion of the active region among the plurality of well regions 4.

A well contact region 6 of p-type, having a higher peak concentration of impurities than that of the well region 4 is selectively formed in the upper layer of the well region 4. The well contact region 6 is a p+ type region containing a relatively high concentration of p-type impurities. Further, a source region 5 of n-type is selectively formed in the upper layer of the well region 4 so as to interpose the well contact region 6 therebetween. The source region 5 is an n+ type region containing a relatively high concentration of n-type impurities. The thickness of the source region 5 and the well contact region 6 is formed thinner than that of the well region 4.

The well contact region 6 is provided to equalize the potentials of the source region 5 and the well region 4 so as to stabilize the switching characteristics of the MOSFET. Further, in the first embodiment, the well contact region 6 is also provided in the impurity region 31 of the electric field relieving region 3. However, the well contact region 6 is not an essential component. That is, the well contact area 6 may be omitted.

A protective oxide film 24 is provided on the epitaxial layer 2 of the terminal region 60 so as to cover at least a part of the electric field relieving region 3. The protective oxide film 24 is formed of, for example, silicon oxide using TEOS, and the thickness thereof is 0.3 µm or more and 3.0 µm or less.

A gate insulating film 21 is formed on the epitaxial layer 2 of the element region 50 so as to cover from the region between the adjacent well regions 4 to the source region 5 in the well region 4, and the gate electrode 22 is formed on the gate electrode 22. The thickness of the gate insulating film 21 is 2 nm or more and 200 nm or less. As illustrated in FIG. 2, the gate insulating film 21 and the gate electrode 22 are also provided so as to cover from the source region 5 in the well region 4 at the outermost periphery portion of the element region 50 to the inner end of the impurity region 31 of the terminal region 60.

The gate insulating film 21, the gate electrode 22, and the protective oxide film 24 are covered with an interlayer insulating film 23. The thickness of the interlayer insulating film 23 is 0.3 µm or more and 3.0 µm or less. A contact hole reaching the source region 5 and the well contact region 6 is formed in the interlayer insulating film 23.

A front surface electrode 10, which is a first main electrode that functions as a source electrode of the MOSFET, is formed on the interlayer insulating film 23. The front surface electrode 10 is connected to the source region 5 and the well contact region 6 through the contact hole formed in the interlayer insulating film 23. The front surface electrode 10 is a metal and is composed of, for example, Al, AlSi, or the like. Further, the front surface electrode 10 may be connected to the impurity region 31 through a contact hole (not illustrated) penetrating the interlayer insulating film 23 and the protective oxide film 24 in the terminal region 60.

The protective oxide film 24 and the interlayer insulating film 23 extend to the outside of the electric field relieving region 3, but do not reach the end portion of the chip of the silicon carbide semiconductor device 100, and the epitaxial layer 2 is exposed from the oxide film 24 and the interlayer insulating film 23 at the end portion of the chip. In the following, the laminated film composed of the protective oxide film 24 and the interlayer insulating film 23 may be collectively referred to as a "first protective film". Further, the protective oxide film 24 and the interlayer insulating film 23 may be made of the same material to have the first protective film made into a single-layer structure. In that case, the material of the protective oxide film 24 and the interlayer insulating film 23 may be an insulating film, and for example, silicon oxide is adoptable.

A silicon nitride film 81 is formed so as to cover the outer end portion of the front surface electrode 10, the interlayer insulating film 23, and the epitaxial layer 2 at the chip end, and a polyimide protective film 12 such as an organic film is provided on the silicon nitride film 81. An opening (hereinafter referred to as "pad opening") that expose the central portion of the front surface electrode 10 that serves as an electrode pad on which wire bonding or the like is performed is formed in the silicon nitride film 81 and the polyimide protective film 12. Further, the silicon nitride film 81 covers at least a part of the epitaxial layer 2 exposed from the protective oxide film 24 and the interlayer insulating film 23 at the chip end portion of the silicon carbide semiconductor device 100. Hereinafter, the polyimide protective film 12 may be referred to as a "second protective film".

On the back surface of the SiC substrate 1 (the surface opposite to the front surface electrode 10), a back surface electrode 11 which is a second main electrode functioning as a drain electrode of the MOSFET is formed. The front surface electrode 10 and the back surface electrode 11 can be made of, for example, Al, Cu, or the like.

When the silicon carbide semiconductor device 100 is in the ON state, a main current flows between the front surface electrode 10 and the back surface electrode 11. That is, the silicon carbide semiconductor device 100 is a vertical semiconductor device in which the main current flows in the thickness direction of the SiC substrate 1.

Here, a description is made on the silicon nitride film 81. The silicon nitride film 81 has an insulating property and is formed with a width wider than that of the polyimide protective film 12. That is, the silicon nitride film 81 protrudes from the polyimide protective film 12 at both the inner side (element region 50 side) end portion and the outer side (terminal region 60 side) end portion of the polyimide protective film 12.

In this manner, with the silicon nitride film 81 protruding from both ends of the polyimide protective film 12, the creeping distance of the silicon nitride film 81 is made longer than in the case of the conventional structure in which the silicon nitride film 81 does not protrude from the polyimide protective film 12. This makes the creeping discharge distance long to suppress the occurrence of discharge when a reverse bias is applied. For example, in a situation where a module in which a silicon carbide semiconductor device 100 is sealed with a sealing material is in practical use, and when the polyimide protective film 12 is peeled off due to the stress caused between the sealing material and the silicon carbide semiconductor device 100, the risk of discharge can be lowered as compared with the conventional structure. The reverse bias application state in the MOSFET is a state in which the source electrode (front surface electrode 10) is biased so as to have a positive potential and the drain electrode (back surface electrode 11) is biased so as to have a negative potential.

Further, it is expected that the electric field applied to the terminal region 60 of the silicon carbide semiconductor device 100 becomes stronger than that of the silicon semiconductor device. Therefore, when the moisture contained in the polyimide protective film 12 reaches the front surface electrode 10, electrolysis of the moisture occurs, and the protective film (the first protective film and second protective film) may be peeled off by the volume expansion of the reaction product formed on the surfaces of the front surface electrode 10 and the epitaxial layer 2. Meanwhile, in the silicon carbide semiconductor device 100, the silicon nitride film 81 having a broader width than the polyimide protective film 12 is provided under the polyimide protective film 12, this prevents the moisture contained in the polyimide protective film 12 from reaching the front surface electrode 10, and the peeling of the protective film above can be prevented.

Also, the polyimide protective film 12 having poor adhesion to the epitaxial layer 2 is prevented from coming into contact with the epitaxial layer 2 with the silicon nitride film 81 protruding from the polyimide protective film 12; therefore, the effect of suppressing the occurrence of peeling of the polyimide protective film 12 is also obtained, contributing to extending the life of the silicon carbide semiconductor device 100.

Figure 3:
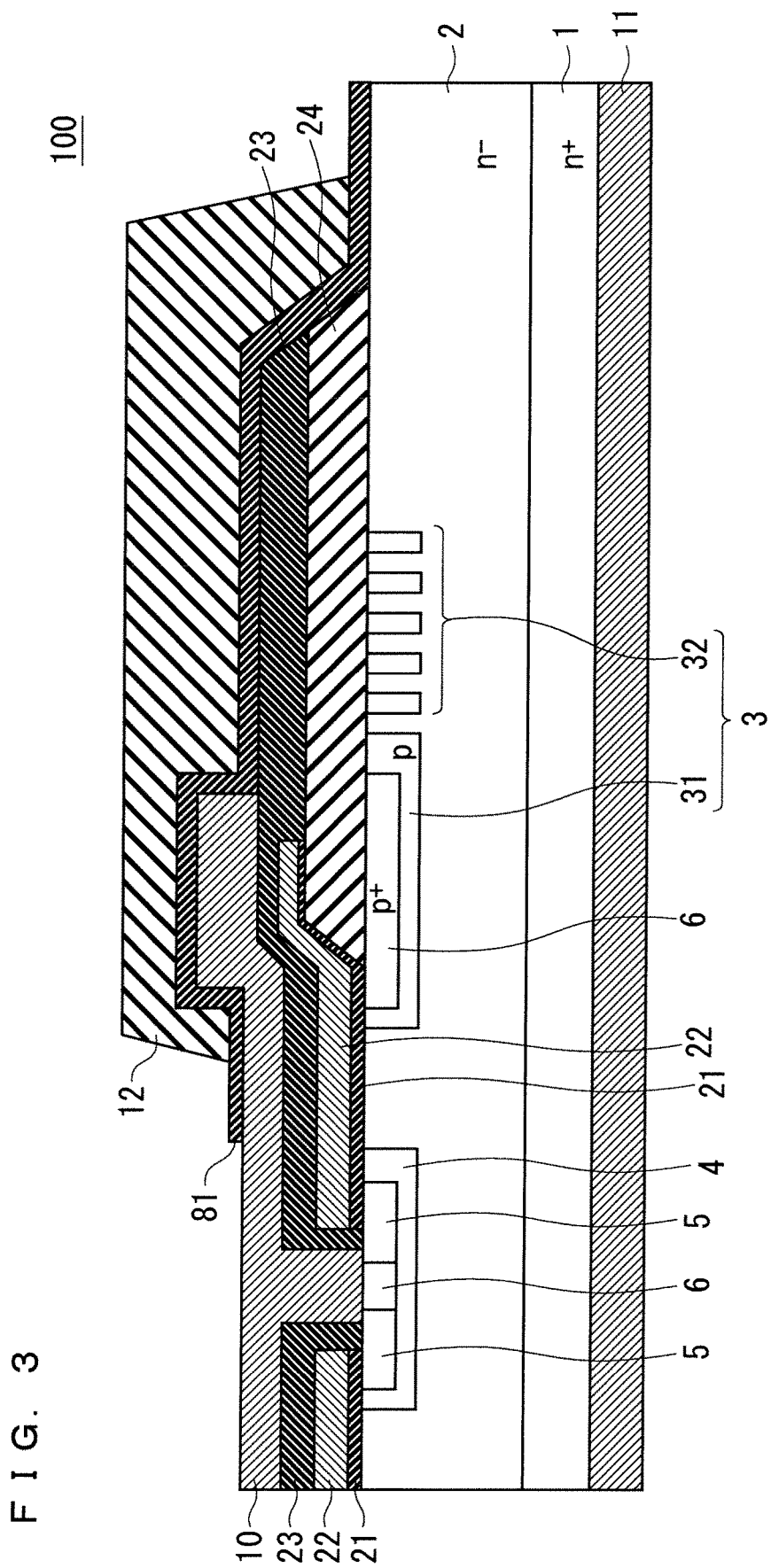
FIG. 3 is a cross-sectional view of a modification example of a silicon carbide semiconductor device according to the first embodiment.

The amount of protruding (protruding length) of the silicon nitride film 81 from the polyimide protective film 12 is preferably 5 μm or more and 20 μm or less, however, as long as the necessary area of the pad opening that exposes the front surface electrode 10 is secured, the amount of protruding may be greater than stated. Although, FIG. 2 illustrates an example in which the silicon nitride film 81 protruding outward from the polyimide protective film 12 does not reach the chip end portion of the silicon carbide semiconductor device 100, as illustrated in FIG. 3, the silicon nitride film 81 may reach the chip end portion of the silicon carbide semiconductor device 100. In the configuration of FIG. 3, the creeping distance of the silicon nitride film 81 becomes longer than that of the configuration of FIG. 2, moreover, the occurrence of peeling off of the polyimide protective film 12 due to the stress between the sealing material and the silicon carbide semiconductor device 100 is suppressed.

Figure 4:
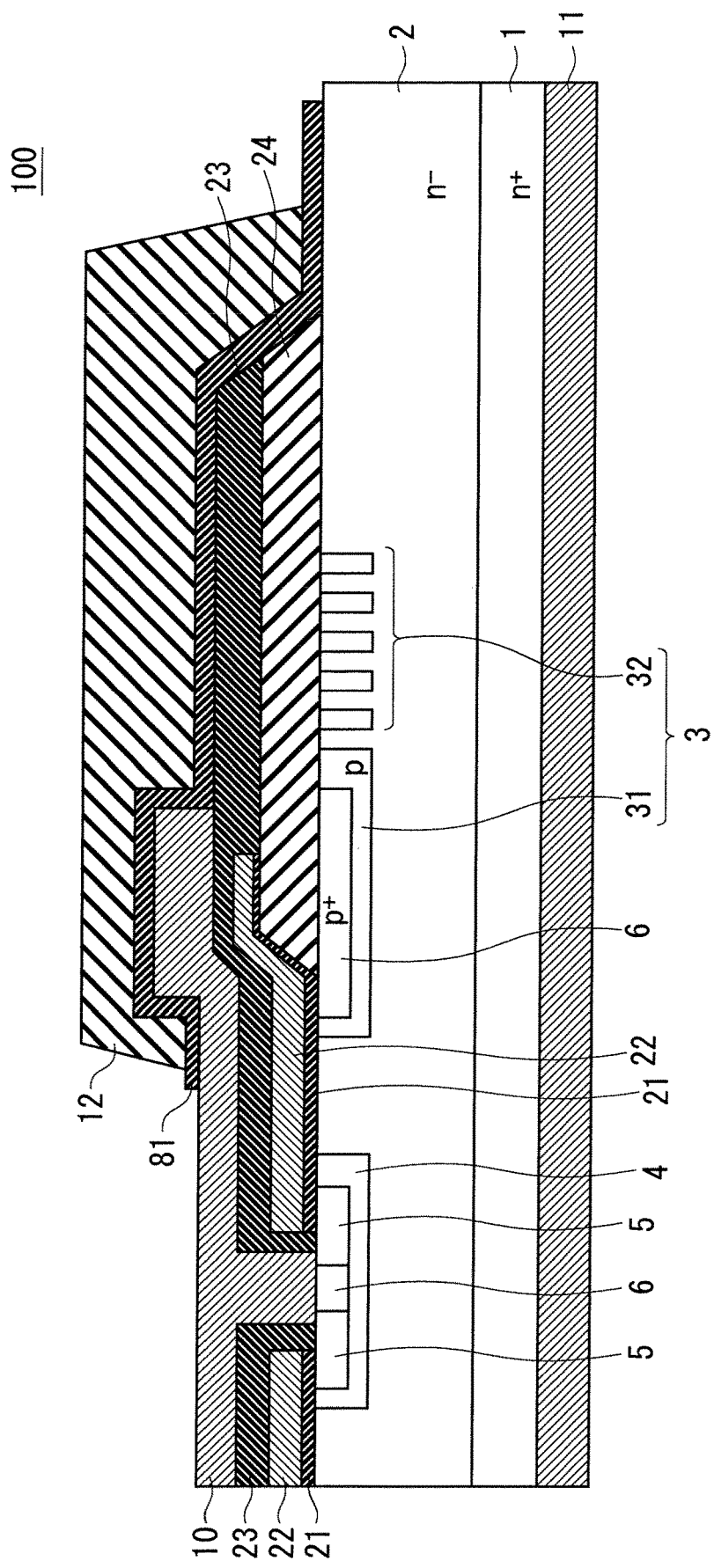
FIG. 4 is a cross-sectional view of a modification example of a silicon carbide semiconductor device according to the first embodiment.

Also, as illustrated in FIG. 4, the amount of protrusion of the silicon nitride film 81 from the inner end portion of the polyimide protective film 12 may be made shorter than the amount of protrusion of the silicon nitride film 81 from the outer end portion of the polyimide protective film 12. As a result, a large area of the pad opening that exposes the front surface electrode 10 can be secured, enhancing the ease of assembly such as wire bonding. Further, the stress caused between the sealing material and the silicon carbide semiconductor device 100 becomes stronger as a position is closer to the chip end; therefore, the stress applied to the polyimide protective film 12 is reduced with the distance from the chip end to the polyimide protective film 12 being made longer, and the polyimide protective film 12 is suppressed from peeling off from the chip end side.

Second Embodiment

Figure 5:
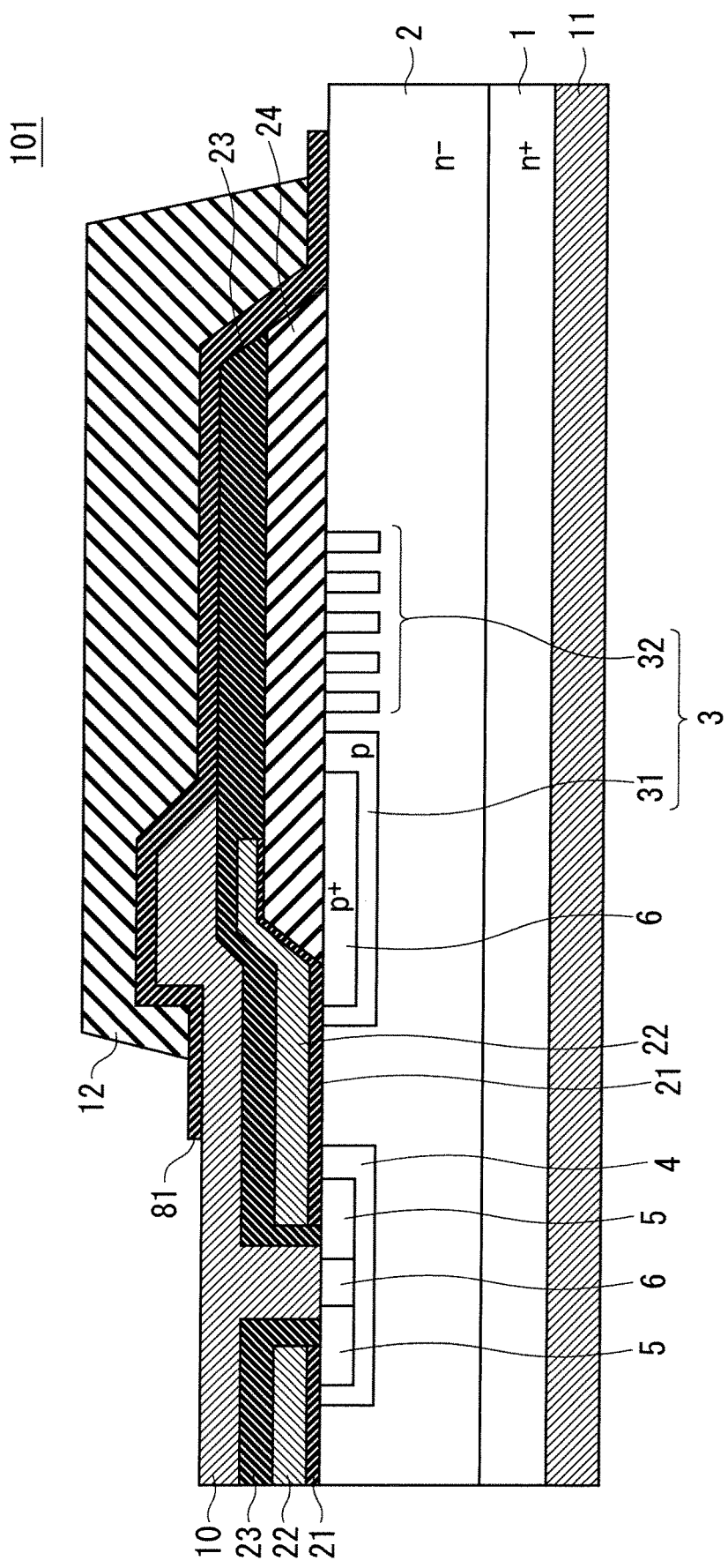
FIG. 5 is a cross-sectional view of a silicon carbide semiconductor device according to the second embodiment.

FIG. 5 is a cross-sectional view of a MOSFET (SiC-MOSFET) which is a silicon carbide semiconductor device 101 according to the second embodiment. In FIG. 5, the same components as those illustrated in FIG. 2 are designated by the same reference numerals. Therefore, the description of the same components as those described in the first embodiment will be omitted here.

As illustrated in FIG. 5, in the silicon carbide semiconductor device 101 according to the second embodiment, the side surface of the end portion of the front surface electrode 10 covered with the silicon nitride film 81 is inclined, whereby the silicon nitride film 81 is prevented from bending at a right angle on the end portion of the front surface electrode 10. The stress caused between the sealing material and the silicon carbide semiconductor device 101 tends to be concentrated on the end portion of the front surface electrode 10, however, the structure eases the stress concentration on the end portion of the front surface electrode 10 and suppresses the occurrence of cracks in the silicon nitride film 81.

When a crack occurs in the silicon nitride film 81, the moisture contained in the polyimide protective film 12 easily reaches the front surface electrode 10, and as described above, the protective film (the first protective film and second protective film) may be peeled off by the reaction product formed by the electrolysis of the moisture. In the second embodiment, the silicon nitride film 81 is prevented from cracking; therefore, the protective film above can be prevented from peeling off, contributing to improving the reliability of the silicon carbide semiconductor device 101.

Third Embodiment

Figure 6:
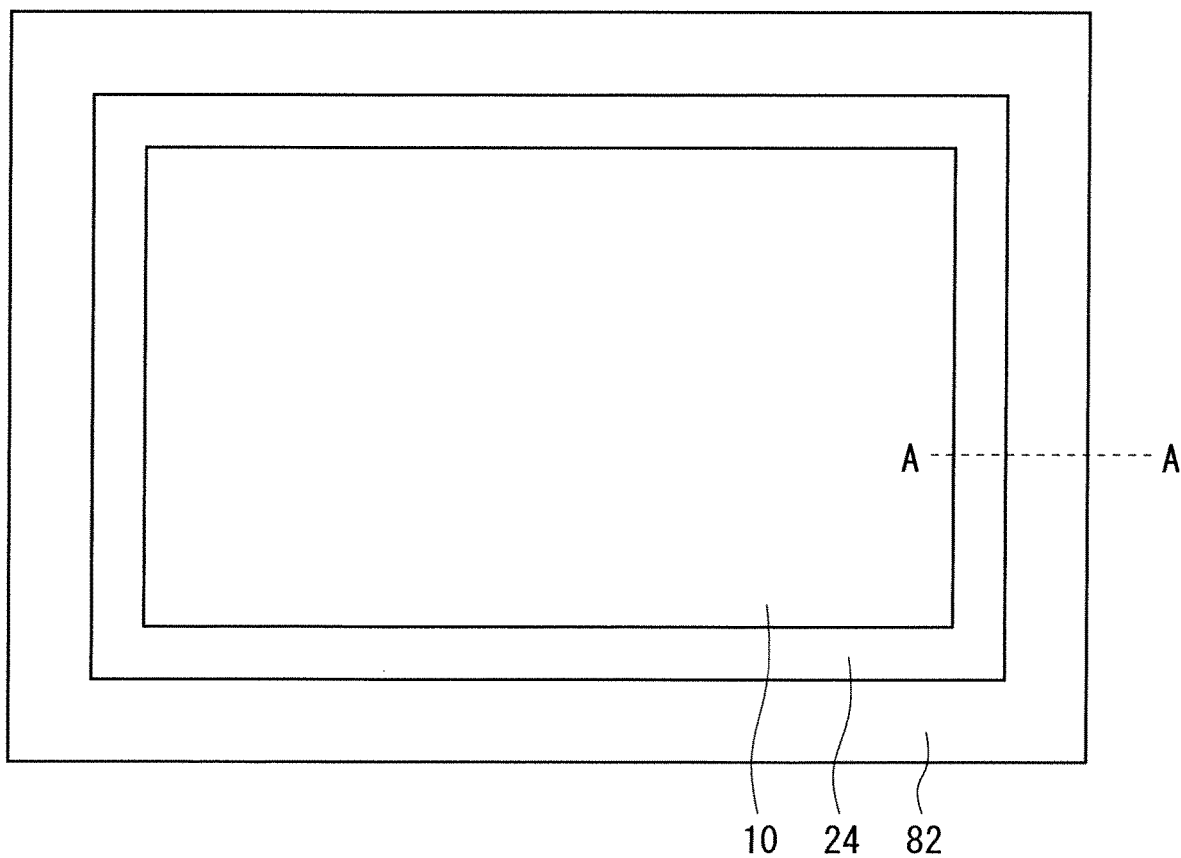
FIG. 6 is a plan view of a silicon carbide semiconductor device according to the third embodiment.
Figure 7:
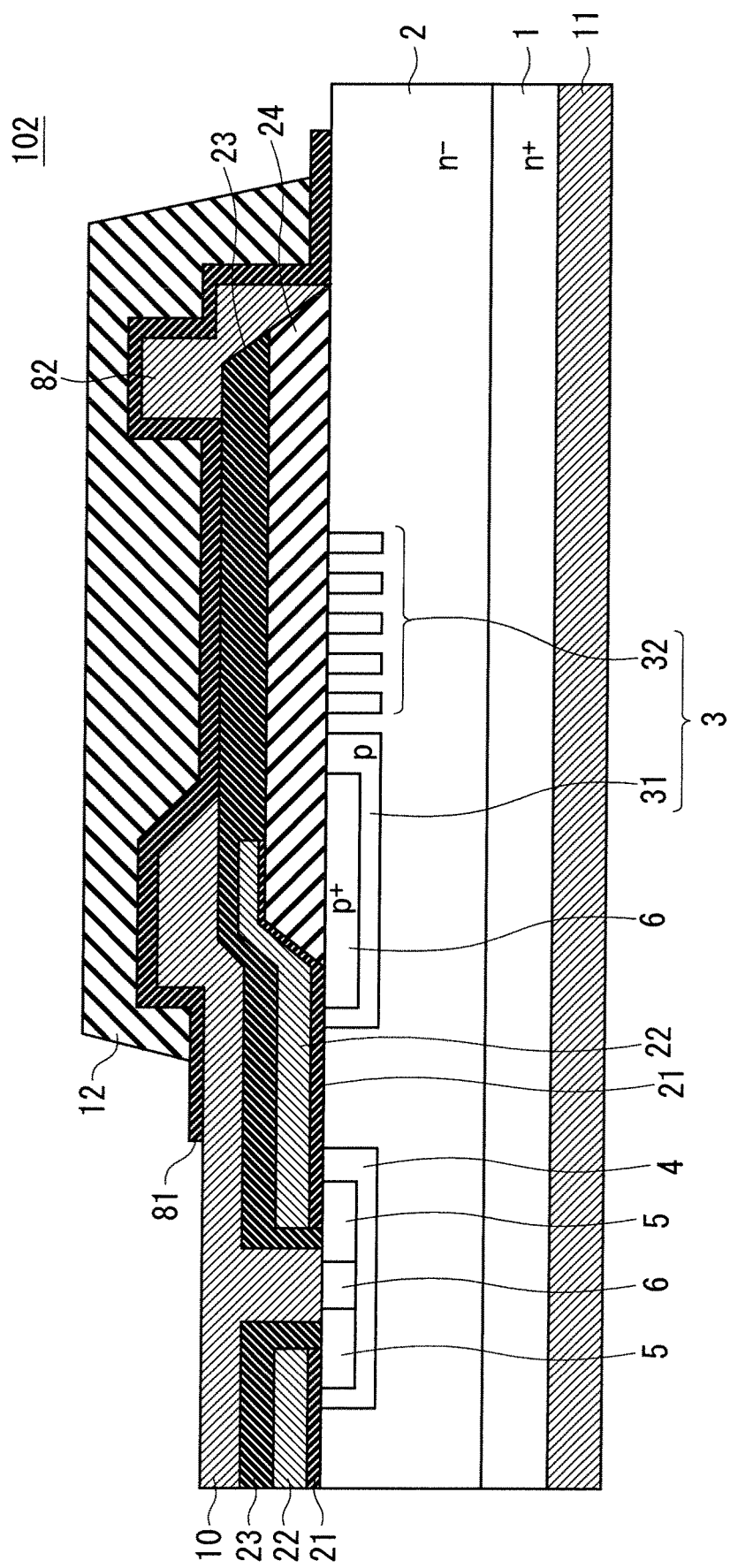
FIG. 7 is a cross-sectional view of the silicon carbide semiconductor device according to the third embodiment.

FIG. 6 is a plan view of a MOSFET (SiC-MOSFET) which is a silicon carbide semiconductor device 102 according to the third embodiment, and FIG. 7 is a cross-sectional view taken along the line A-A of FIG. 6. In FIGS. 6 and 7, the same components as those illustrated in FIG. 2 are designated by the same reference numerals. Therefore, the description of the same components as those described in the first embodiment will be omitted here.

As illustrated in FIGS. 6 and 7, the silicon carbide semiconductor device 102 according to the third embodiment is provided with an electrode 82 (hereinafter referred to as a "frame electrode") having a frame-shape in plan view so as to cover the outer end of a first protective film composed of an interlayer insulating film 23 and a protective oxide film 24 and a silicon nitride film 81 is provided so as to cover the frame electrode 82. The frame electrode 82 extends so as to cover the entire circumference of the outer edge portion of the first protective film in plan view. Note that FIG. 6 illustrates only the front surface electrode 10, the protective oxide film 24 (first protective film), and the frame electrode 82 for convenience of description, and the illustration of other configurations is omitted. The material of the frame electrode 82 may be Al, AlSi, or the like, which is the same as that of the front surface electrode 10. In that case, the frame electrode 82 can be formed through the same process as that of the front surface electrode 10.

As illustrated in FIG. 7, covering the end portion of the first protective film, the frame electrode 82 has a stair-shape in which a step is formed at a position corresponding to the end portion of the first protective film. Therefore, the cross-sectional shape of the silicon nitride film 81 that covers the frame electrode 82 is bent along the stair-shape, and the creeping distance of the silicon nitride film 81 increases by that amount. Hence, the creeping discharge distance is made longer without broadening the width of the terminal region 60, enhancing the effect of suppressing discharge when reverse bias is applied.

Although in the first to third embodiments, a MOSFET is illustrated as silicon carbide semiconductor devices, the silicon carbide semiconductor device is not limited to a MOSFET, and an Insulated-Gate Bipolar Transistor (IGBT), a Schottky Barrier Diode (SBD), a Junction Barrier Diode (JBS), a pn junction diode, a junction field-effect transistor (JFET), or the like, may be adoptable. Further, in the above description, although the n-type represents the first conductive type and the p-type represents the second conductive type, the p-type may represent the first conductive type and the n-type may represent the second conductive type in a reversed manner.

Fourth Embodiment

In the fourth embodiment, the semiconductor device according to the above-described first to third embodiments is applied to a power conversion apparatus. The application of the semiconductor device according to the first to third embodiments is not limited to a specific power conversion apparatus, in the fourth embodiment, a three-phase inverter is illustrated as an example of the power conversion apparatus.

Figure 8:
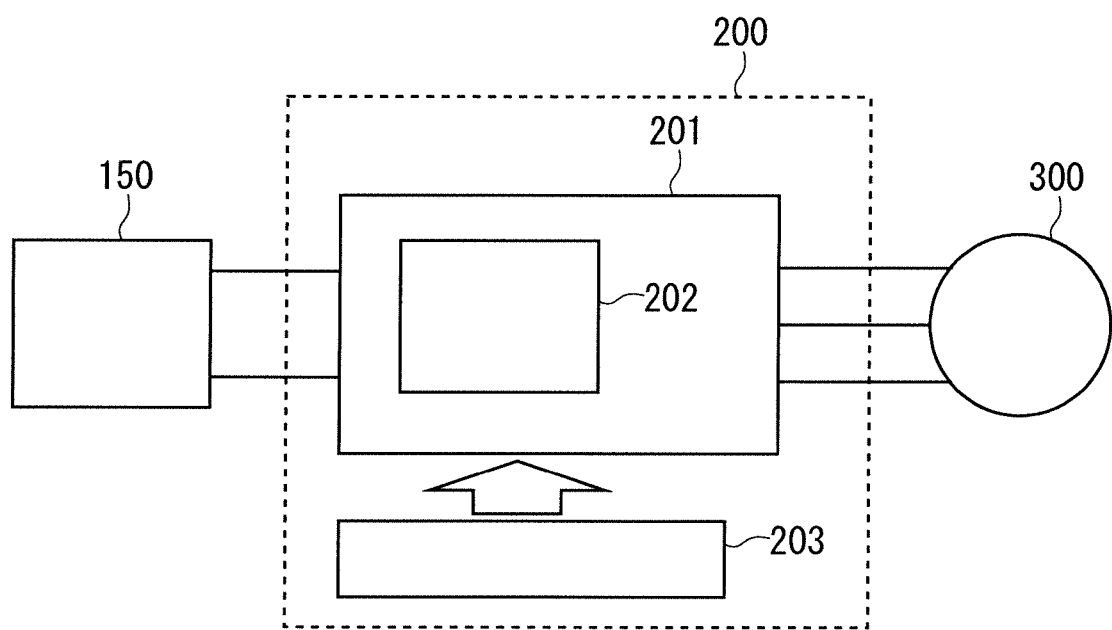
FIG. 8 is a block diagram illustrating a configuration a power conversion system to which a power conversion apparatus according to the fourth embodiment is applied.

FIG. 8 is a block diagram illustrating a configuration a power conversion system to which a power conversion apparatus according to the fourth embodiment is applied.

The power conversion system illustrated in FIG. 8 includes a power supply 150, a power conversion apparatus 200, and a load 300. The power supply 150 is a DC power supply and supplies DC power to the power conversion apparatus 200. The power supply 150 can be configured with various components, for example, the configuration thereof may include a DC system, a solar cell, and a storage battery, or include a rectifier circuit connected to an AC system or an AC/DC converter. Further, the power supply 150 may be configured by a DC/DC converter that converts the DC power output from the DC system into a specific power.

The power conversion apparatus 200 is a three-phase inverter connected between the power supply 150 and the load 300, which converts the DC power supplied from the power supply 150 into AC power and supplies AC power to the load 300. As illustrated in FIG. 8, the power conversion apparatus 200 includes a main conversion circuit 201 that converts DC power into AC power and outputs thereof, and a control circuit 203 that outputs a control signal for controlling the main conversion circuit 201 to the main conversion circuit 201.

The load 300 is a three-phase electric motor driven by AC power supplied from the power conversion apparatus 200. The load 300 is not limited to a specific application, and is an electric motor mounted on various electric devices. For example, the load 300 is used as an electric motor for a hybrid vehicle, an electric vehicle, a railroad vehicle, an elevator, or an air conditioning apparatus.

Hereinafter, the detailed description is made on the power conversion apparatus 200. The main conversion circuit 201 includes a switching element and a freewheeling diode (not illustrated), and by switching the switching element, the DC power supplied from the power supply 150 is converted into AC power and supplied to the load 300. There are various specific circuit configurations of the main conversion circuit 201, and the main conversion circuit 201 according to the fourth embodiment is a two-level three-phase full bridge circuit, and has six switching elements and six freewheeling diodes each of which is anti-parallel with the respective switching elements. At least one of each switching element and each freewheeling diode of the main conversion circuit 201 is configured by a semiconductor module 202 corresponding to any one of the above-described embodiments 1 to 3. Each of the two switching elements connected in series of the six switching elements constitutes an upper and lower arm, and each upper and lower arm constitutes each phase (U phase, V phase, W phase) of the full bridge circuit. Then, the output terminal of each upper and lower arm, that is, the three output terminals of the main conversion circuit 201 are connected to the load 300.

Further, the main conversion circuit 201 includes a drive circuit (not illustrated) for driving each switching element, and the drive circuit may be built in the semiconductor module 202, or a configuration in which the drive circuit is provided separately from the semiconductor module 202 may be adoptable. The drive circuit generates a drive signal for driving the switching element of the main conversion circuit 201 and supplies the drive signal to the control electrode of the switching element of the main conversion circuit 201. Specifically, in response to the control signal from the control circuit 203 described later, a drive signal for turning on the switching element and a drive signal for turning off the switching element are output to the control electrode of each switching element. When the switching element is kept in the ON state, the drive signal is a voltage signal (ON signal) equal to or higher than a threshold voltage of the switching element, and when the switching element is kept in the OFF state, the drive signal is a voltage signal (OFF signal) equal to or lower than the threshold voltage of the switching element.

The control circuit 203 controls the switching elements of the main conversion circuit 201 so that the desired power is supplied to the load 300. Specifically, the time (ON time) for each switching element of the main conversion circuit 201 to be in the ON state is calculated based on the power to be supplied to the load 300. For example, the main conversion circuit 201 is controlled by PWM control that modulates the ON time of the switching element according to the voltage to be output. Then, a control command (control signal) is output to the drive circuit provided in the main conversion circuit 201 so that an ON signal is output to the switching element supposed to be turned on at each time point and an OFF signal is output to the switching element supposed to be turned off. The drive circuit outputs an ON signal or an OFF signal as a drive signal to the control electrode of each switching element according to the control signal.

In the power conversion apparatus according to the fourth embodiment, the semiconductor module according to any one of the first to third embodiments is applied as the switching elements and the freewheeling diodes of the main conversion circuit 201; therefore, the discharge when the reverse bias is applied is suppressed, achieving the improvement of reliability.

Although in the fourth embodiment, an example in which any one of the first to third embodiments is applied to the two-level three-phase inverter has been described, the embodiment is not limited there to, and can be applied to various power conversion apparatuses. Although in the fourth embodiment, a two-level power conversion apparatus is adopted, a three-level or multi-level power conversion apparatus may also be adoptable, and when power is supplied to a single-phase load, the first to third embodiments may also be adopted to a single-phase inverter. Further, when supplying power to a DC load or the like, any one of the first to third embodiments is adoptable to the DC/DC converter or the AC/DC converter.

Further, the power conversion apparatus to which any one of the first to third embodiments is applied is not limited to the case where the above-mentioned load is an electric motor, the power conversion apparatus can be applied to the case where a load is a power supply device for an electric discharge machine, a laser machine, an induction heating cooker, or a contactless power supply system, further applied to the case where a load is a power conditioner for a solar power generation system and a power storage systems, for example.

In the present disclosure, the embodiments can be combined, appropriately modified or omitted.

While the disclosure has been illustrated and described in detail, the foregoing description is in all aspects illustrative and not restrictive. It is therefore understood that numerous modifications and variations can be devised.

What is claimed is:

1. A silicon carbide semiconductor device comprising:
a semiconductor substrate composed of silicon carbide;
a semiconductor layer of first conductivity type provided on the semiconductor substrate;
a first main electrode provided on the semiconductor layer;
a second main electrode provided on a back surface of the semiconductor substrate;
an electric field relieving region of second conductivity type provided in an upper layer of the semiconductor layer in a terminal region outside an element region in which the main current flows;
a first protective film provided on the semiconductor layer and covering at least a part of the electric field relieving region;
a silicon nitride film covering an outer end portion of the first main electrode, the first protective film, and at least a part of the semiconductor layer outside the first protective film; and
a second protective film provided on the silicon nitride film, wherein
the silicon nitride film protrudes from the second protective film at both an inner side end portion and an outer side end portion.

2. The silicon carbide semiconductor device according to claim 1, wherein
a protruding length the silicon nitride film protrudes from the inner side end portion of the second protective film is shorter than a protruding length the silicon nitride film protrudes from the outer side end portion of the second protective film.

3. The silicon carbide semiconductor device according to claim 1, wherein
the silicon nitride film extends to a chip end portion of the silicon carbide semiconductor device.

4. The silicon carbide semiconductor device according to claim 1, wherein
a side surface of the end portion of the first main electrode covered with the silicon nitride film is inclined.

5. The silicon carbide semiconductor device according to claim 1, further comprising
a frame electrode covering an outer end portion of the first protective film and having a stair-shape having a step that fits the outer end portion of the first protective film, wherein
the silicon nitride film covers the frame electrode.

6. A power conversion apparatus comprising:
a main conversion circuit configured to convert power to be input and output thereof, the main conversion circuit having the silicon carbide semiconductor device according to claim 1; and
a control circuit configured to output a control signal for controlling the main conversion circuit to the main conversion circuit.

* * * * *